United States Patent
Maixner

(10) Patent No.: US 12,332,332 B1
(45) Date of Patent: Jun. 17, 2025

(54) CIRCUIT ARRANGEMENT FOR CORRECTING AN INPUT SIGNAL, AND MRI-ET HYBRID IMAGING DEVICE

(71) Applicant: Bruker BioSpin GmbH & Co. KG, Ettlingen (DE)

(72) Inventor: Michael Maixner, Bietigheim (DE)

( * ) Notice: Subject to any disclaimer, the term of this patent is extended or adjusted under 35 U.S.C. 154(b) by 0 days.

(21) Appl. No.: 18/977,220

(22) Filed: Dec. 11, 2024

(30) Foreign Application Priority Data

Dec. 15, 2023 (DE) ..................... 10 2023 212 778.4

(51) Int. Cl.
*G01R 33/48* (2006.01)
*G01R 33/385* (2006.01)

(52) U.S. Cl.
CPC ......... *G01R 33/481* (2013.01); *G01R 33/385* (2013.01)

(58) Field of Classification Search
CPC ............................ G01R 33/481; G01R 33/385
See application file for complete search history.

(56) References Cited

U.S. PATENT DOCUMENTS 3,872,285 A * 3/1975 Shum ..................... B23Q 15/00
73/104
5,297,213 A 3/1994 Holden

FOREIGN PATENT DOCUMENTS

WO 02013689 A2 2/2002

OTHER PUBLICATIONS

Flogeras et al. "Development of a Low Cost Elecromyogram (EMG) Circuit for EMG Tracking", IEEE XPLORE, 2023, pp. 1-7.
crystal-radio.eu, RF Diode detector / AM demodulator [online], [retrieved on May 6, 2025]. Retrieved from the Internet <URL: http://htttts://www.crystal-radio.eu/diodedetector/endiodetector.htm>.
Tao "Development of a silicon photomultiplier based gamma camera", McMaster University, Oct. 2011.
Kelley et al. "LTC6244 High Speed Peak Detector", Analog Devices, [online], [retrieved on May 6, 2025]. Retrieved from the Internet <URL: https://www.analog.com/en/resources/technical-articles/ltc6244-high-speed-peak-detector.html>.

\* cited by examiner

*Primary Examiner* — G. M. A Hyder
(74) *Attorney, Agent, or Firm* — BENOIT & COTE INC.

(57) ABSTRACT

A circuit arrangement for correcting an input signal that includes a useful signal with a useful frequency and an interference signal with an interference frequency comprises: a high-pass filter with a cut-off frequency; an inverting operational amplifier circuit connected downstream from the high-pass filter and connected in series with the high-pass filter; an active rectifier circuit connected downstream from the inverting operational amplifier circuit and connected in series thereto, with two parallel-connected line paths, wherein each line path comprises a rectifying element; and a summing amplifier circuit connected downstream from the rectifier circuit, wherein the summing amplifier circuit has an inverting input and a non-inverting input and each line path is electrically connected to one of the inputs of the summing amplifier circuit. This provides a simple and compact circuit arrangement with which interference signals can be effectively suppressed.

14 Claims, 5 Drawing Sheets

CIRCUIT ARRANGEMENT FOR CORRECTING AN INPUT SIGNAL, AND MRI-ET HYBRID IMAGING DEVICE

BACKGROUND OF THE INVENTION

Field of the Invention

The invention relates to a circuit arrangement for correcting an input signal, wherein the input signal at an input interface of the circuit arrangement comprises a useful signal with a useful frequency and an interference signal with an interference frequency, as well as a hybrid imaging device with such a circuit arrangement.

Description of the Related Art

In particular, in MRI-ET hybrid imaging devices that comprise a magnetic resonance imaging (MRI) arrangement with an RF resonator structure and gradient coil system and an emission tomography (ET) arrangement with a detector apparatus (e.g. with silicon photomultiplier (SiPM) arrays), there is a risk that interference and mutual influences of components of both imaging modalities will lead to an undesired influence on the detected signal. In particular, fast gradient switching operations lead to an interference signal that overlaps the useful signal. The interference mostly lies in the range below 100 kHz and is relatively low frequency compared to the useful signal, the frequency components of which mostly lie above 100 MHz.

Patent document WO 0213689 discloses a method for reducing contamination of electrical signals that were recorded in the presence of repeated interference contaminants. The method comprises obtaining an electrical signal, wherein the electrical signal has been recorded in the presence of a contaminating signal, and the detection of a time signal that occurs at a fixed point in time during the electrical signal relative to the onset of the contaminating signal. In this method, the noise signal is first extracted and then subtracted from the signal mixture. This method only works well if the interference signal always looks the same and the useful signal does not occur synchronously with the interference signal.

In principle, a high-pass filter can be used to filter out low-frequency interference. However, the closer the cutoff frequency of the high-pass filter lies to the frequency of the useful signal, the more the useful signal is distorted. A balance must therefore be struck between suppression of the interference signal and distortion of the useful signal. Since the integral over the pulse is important for signal evaluation, only a filter with a relatively low cutoff frequency can be used. However, a large part of the interference then remains after the filter. A complex additional circuit is necessary to achieve sufficient suppression.

SUMMARY OF THE INVENTION

The invention provides a simple and compact circuit arrangement with which interference signals caused by the switching of gradients and by other influences, in particular when using silicon photomultiplier (SiPM) arrays as signal detectors, can be suppressed to such an extent that an evaluation of the data can be as interference-free as possible. This is achieved by a switching arrangement and a hybrid imaging device according to the invention.

The circuit arrangement according to the invention comprises:

a high-pass filter with a cutoff frequency,
an inverting operational amplifier circuit connected downstream from the high-pass filter and connected in series with the high-pass filter,
an active rectifier circuit connected downstream from the inverting operational amplifier circuit and connected in series therewith, having two parallel-connected conduction paths, wherein each conduction path comprises a rectifying element, and
a summing amplifier circuit connected downstream from the rectifier circuit, wherein the summing amplifier circuit has an inverting input and a non-inverting input, and each conduction path is electrically connected to one of the inputs of the summing amplifier circuit.

The circuit arrangement according to the invention allows the use of a high-pass filter whose cutoff frequency is close to the frequency of the useful signal so that interference can be effectively filtered out. The associated distortion is accepted in the circuit arrangement according to the invention and corrected by the components downstream from the high-pass filter. In particular, the high-pass filter can consist of only one capacitor.

The circuit arrangement according to the invention can be constructed relatively compactly, which is particularly advantageous for measuring systems that require a large number of these circuit assemblies at the same time, as is the case, for example, with an MRI-ET hybrid imaging device.

The useful signal may have a useful frequency spectrum greater than 50 MHZ, in particular greater than 100 MHz. The interference signal may have an interference frequency spectrum greater than 1 MHZ, in particular greater than 10 KHz.

In an exemplary embodiment, diodes may be used as rectifying elements, and the rectifying elements of the rectifier circuit may be connected in different directions. This distributes the positive and negative edges of the signal pulse on different paths. The information of the signal is then distributed over a positive and a negative half-wave.

In another embodiment, the cutoff frequency of the high-pass filter is at most a factor of 10 smaller than the frequency of the useful signal, in particular a factor of between 5 and 10 smaller than the useful signal. The cutoff frequency of the high-pass filter may be at least a factor of 100 higher than the frequency of the interference signal.

It is advantageous if the inverting operational amplifier circuit has a low-ohmic input resistance, preferably with a resistance of less than 10 ohms. The inverting operational amplifier circuit is a low-impedance operational amplifier circuit, that is, the input of the operational amplifier is at 0V, and the input resistance of the operational amplifier circuit is very small. By combining a high-pass filter and an operational amplifier, the signal voltage is first converted into a signal current (at the input of the operational amplifier circuit) and then back into a signal voltage (at the output of the operational amplifier circuit).

It is also advantageous if a low-pass filter is connected downstream from each rectifying element. The low-pass filter allows information to be temporarily stored, which is advantageous with regard to the subsequent merging of the partial signals.

In one particular embodiment of the circuit arrangement according to the invention, an integrator circuit with a reset function is provided with an integrator connected downstream from the summing amplifier circuit and with a reset switching branch, wherein the reset switching branch is designed to tap a control signal downstream from the inverting operational amplifier circuit, preferably between the inverting operational amplifier circuit and the rectifier circuit, and wherein the reset switching branch comprises a switch which bridges a capacitor of the integrator. The switch is controlled using the tapped control signal. This allows the time between the useful signal pulses to be "muted". For this purpose, a control signal is tapped after the inverting operational amplifier circuit where the interference signal has already been largely filtered out, and a suitable threshold value is selected to activate the switch. In this way, interference suppression can be further improved.

The reset switching branch may comprise a delay element. The delay element causes the switch to remain open for a short time after the threshold value is exceeded so that the entire processed useful signal pulse arrives at the signal output.

A low-pass filter may be connected downstream from the summing amplifier circuit. The low-pass filter causes an integration (smoothing) of the signal.

The circuit arrangement according to the invention may also be used for correcting an input signal, wherein the input signal comprises a useful signal with a useful frequency spectrum and an interference signal with an interference frequency spectrum. In particular, the circuit arrangement according to the invention is used for correcting an input signal of a hybrid imaging device comprising a magnetic resonance imaging (MRI) arrangement with a gradient coil system.

The invention also relates to a hybrid imaging device comprising a magnetic resonance imaging (MRI) arrangement with a gradient coil system, an emission tomography (ET) arrangement with a detector apparatus comprising a photosensor, wherein the ET and MR assemblies have a common bore in which the detector apparatus is arranged, and a signal line which conducts the useful signals from the detector apparatus to an image processing unit outside the bore, wherein the image processing unit comprises a previously described circuit arrangement.

The interferences that affect the PET signal come mainly from the gradient circuits of the MRI arrangement. The switching of the gradients induces an interference signal in the PET signal lines, which can be filtered out with the circuit arrangement according to the invention.

The emission tomography (ET) arrangement may be a positron emission tomography (PET) arrangement. The photosensor may be a silicon photomultiplier, and the useful signal an analog signal.

Further advantages of the invention can be found in the description and the drawings. Likewise, according to the invention, the aforementioned features and those which are to be explained below can each be used individually or together in any desired combinations. The embodiments shown and described are not to be understood as an exhaustive list, but, rather, have an exemplary character for the description of the invention.

DETAILED DESCRIPTION

Figure 1:
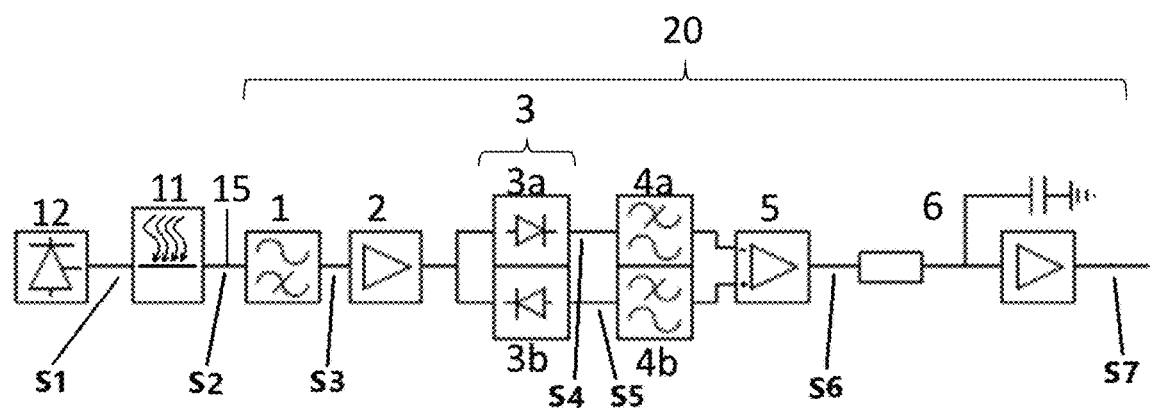
FIG. 1 shows a block diagram of a circuit arrangement according to the invention without an integrator circuit with reset function.

FIG. 1 shows a detector apparatus 12 which is connected to a simple embodiment of the circuit arrangement 20 according to the invention via a signal line 30. At the input (input interface 15) of the circuit arrangement 20 (signal input), there is an input signal S2 which is a superposition of a useful signal S1 detected by the detector apparatus 12 and interference 11 which couples an interference signal into the signal line 30 between the detector apparatus 12 and the circuit arrangement 20 according to the invention.

Figure 3:
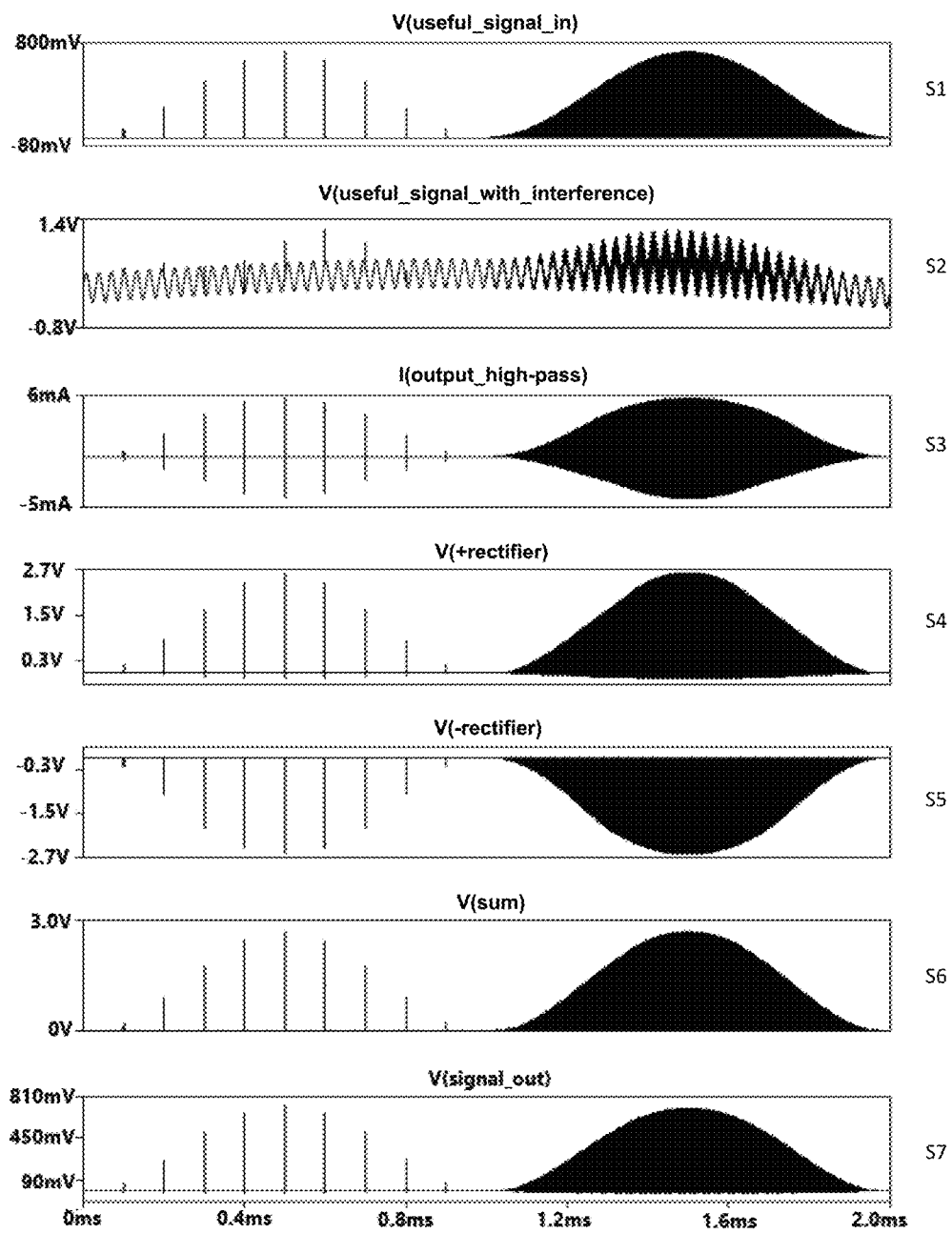
FIG. 3 shows a signal combination of individual and rapidly successive useful signals of different amplitudes at different locations of the circuit arrangement according to the invention.
Figure 4:
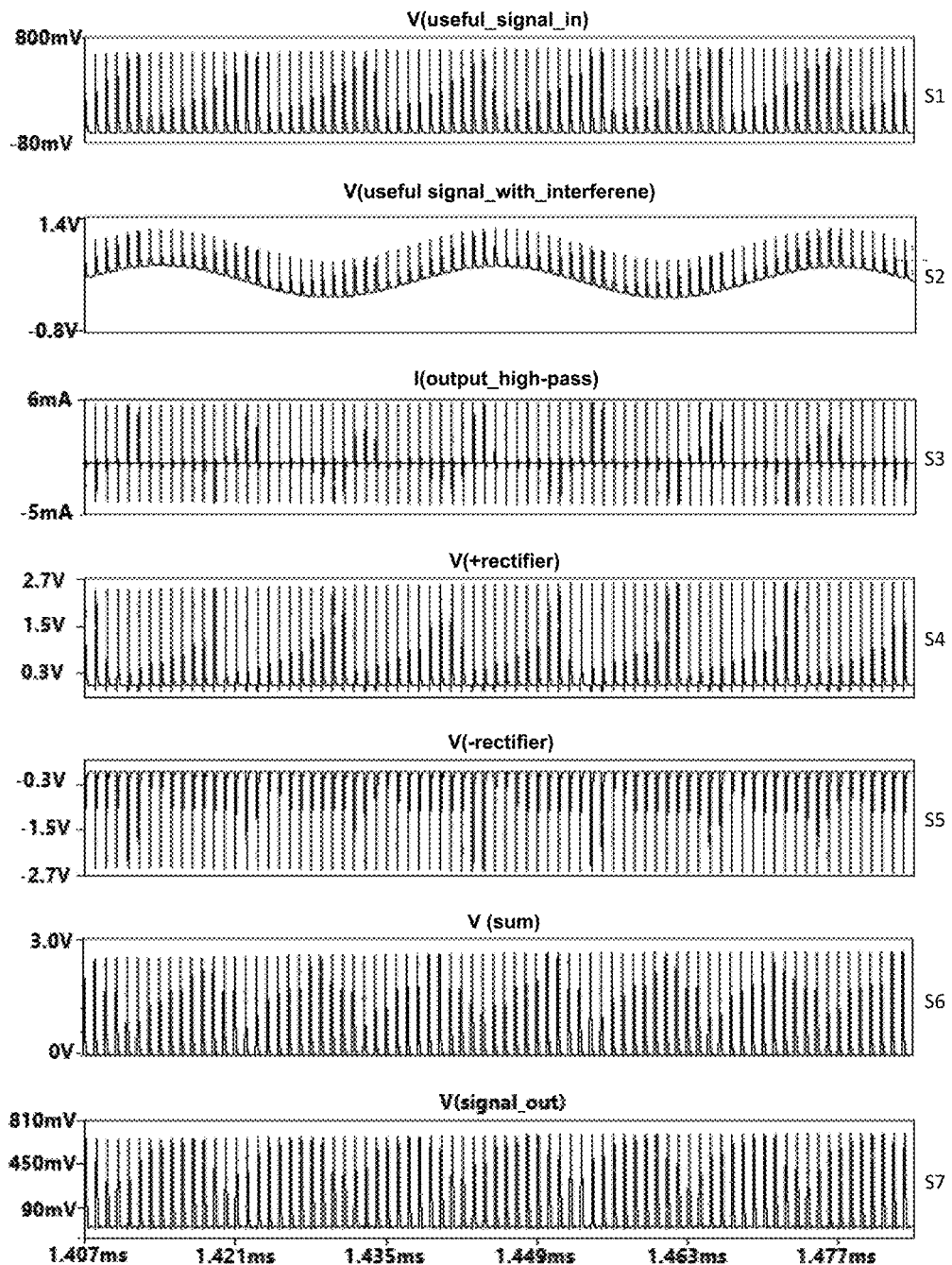
FIG. 4 shows an enlarged extract from the signal combination from FIG. 3.
Figure 5:
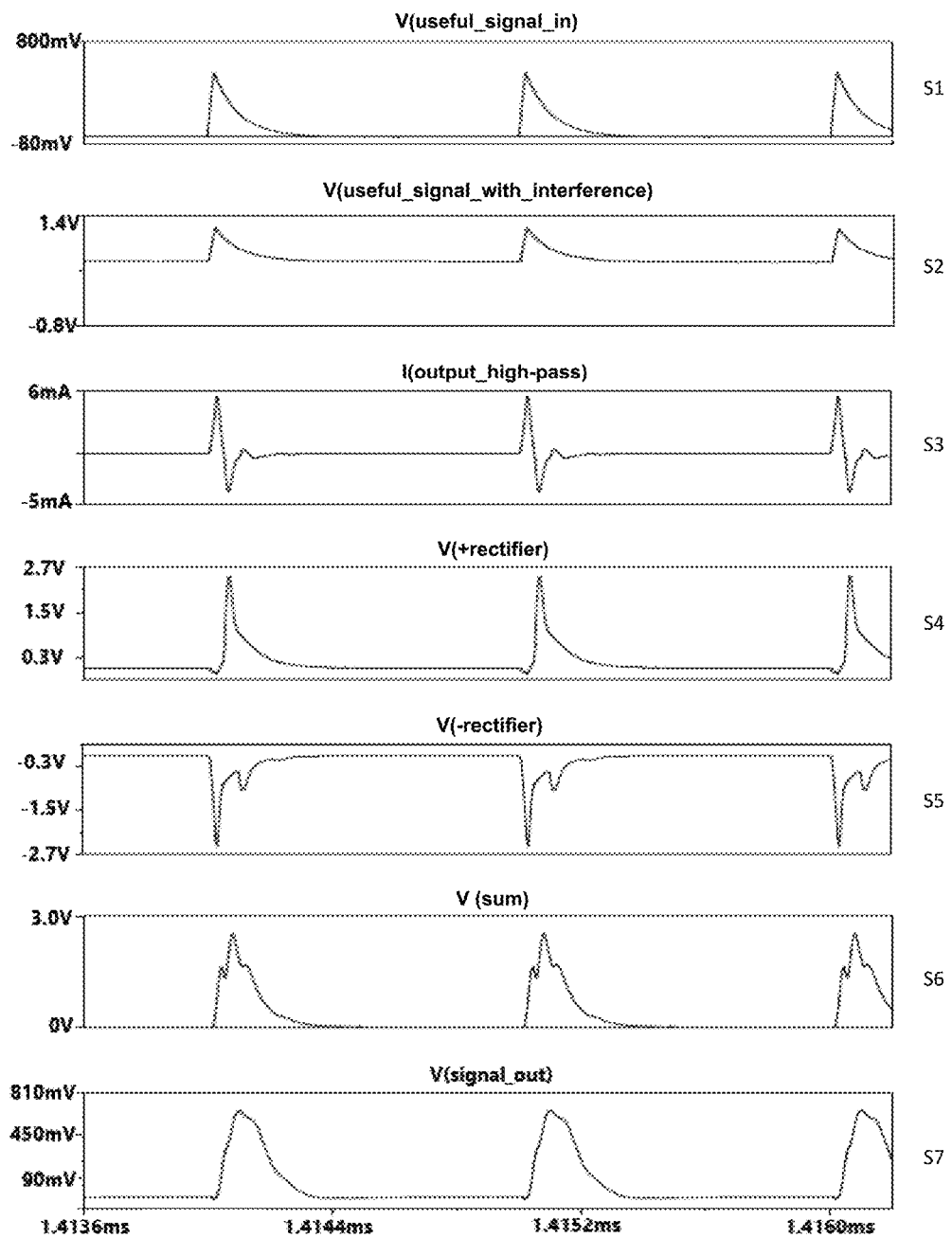
FIG. 5 shows a further enlarged extract from the signal combination from FIG. 3 compared to FIG. 4.

The useful signal S1 and signals S2-S7, which are applied to the various components of the circuit arrangement 20 are shown in FIGS. 3-5.

Low-frequency interference signals are initially filtered out by a high-pass filter 1. The high-pass filter 1 is terminated by a low-impedance operational amplifier circuit 2. By combining high-pass filter 1 and operational amplifier circuit 2, the signal voltage is first converted into a signal current S3 (at the input of the operational amplifier circuit) and then back into a signal voltage (at the output of the operational amplifier circuit). The signal S3 is distorted by convolution effects. The signal at the output of the inverting operational amplifier circuit (not shown in FIG. 3-5) consists of a positive and a negative oscillation, which represent the edges of the useful signal pulse S1. Interference signals are already suppressed to a very high degree here (and also already in S3).

The low-impedance operational amplifier circuit 2 is connected downstream from an, in particular active, rectifier circuit 3. The rectifier circuit 3 comprises two parallel-connected conduction paths, wherein each conduction path comprises a rectifying element 3a, 3b. The rectifying elements 3a, 3b can be, for example, diodes that are connected in opposite directions in the two paths so that the information of the high-pass filtered signal S3 is distributed to a positive and a negative half-wave (partial signals S4, S5 offset in time). Optional low-pass filters 4a, 4b in the respective paths enable the temporary storage of information. Through a summing amplifier circuit 5, the partial signals S4, S5 are recombined by inverting one of the partial signals S4, S5 and summing it to the other partial signal. By splitting the signal S3 into partial signals S4, S5 by the rectifier circuit 3 and the subsequent inversion of one of the partial signals S4, S5 by the summing amplifier circuit 5, two positive partial signals (not shown in FIG. 3-5) result which are then combined at the amplifier output (S6). A downstream low-pass filter 6 (RC element) produces a smoothed output signal at the signal output S7, whose amplitude is proportional to the amplitude of the useful signal S1.

Figure 2:
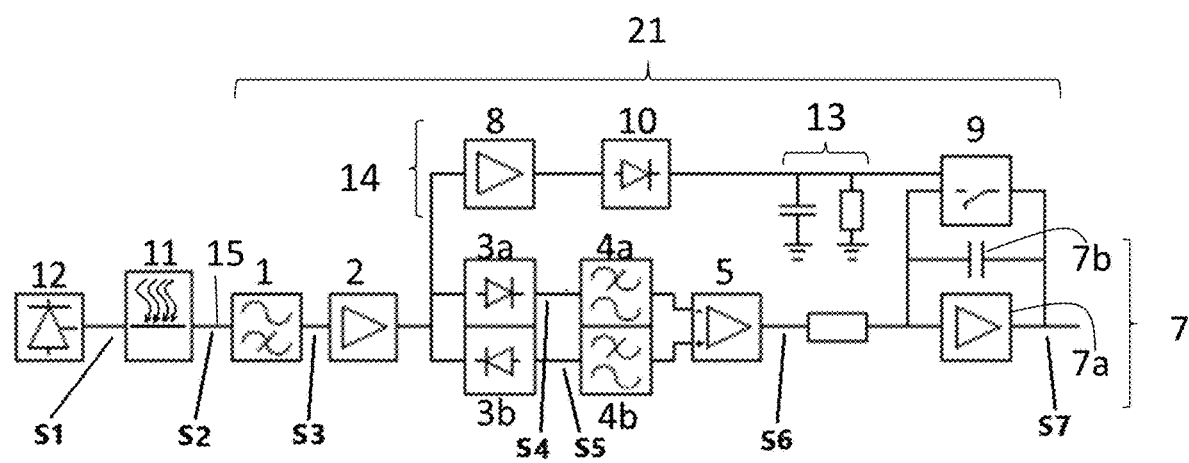
FIG. 2 shows a block diagram of a circuit arrangement according to the invention with an integrator circuit with reset function.

Particularly in MRI-ET hybrid imaging devices, the useful signal S1 comprises pulses (useful signal pulses). Between these useful signal pulses, the useful signal is 0, and the input signal S2 therefore only contains interference signals between these useful signal pulses. These can be suppressed by an integrator circuit 7, 14 with reset function. A corresponding circuit arrangement is shown in FIG. 2. FIG. 2 shows the detector apparatus 12 as well as a particularly preferred embodiment of the circuit arrangement 21 according to the invention with such an integrator circuit 7, 14 with reset function. The embodiment of the circuit arrangement 21 shown in FIG. 2 comprises, in addition to the components described in FIG. 1, a reset switching branch 14 and an integrator 7. The integrator 7 comprises an operational amplifier 7a and a capacitor 7b connected in parallel to the operational amplifier 7a. The reset switching branch 14 comprises a switch 9 which bridges the capacitor 7b of the integrator 7. When the switch 9 is closed, the capacitor 7b of the integrator 7 is short-circuited, and the high-impedance amplifier output of the operational amplifier 7a is connected to its amplifier input. The result is an output voltage of 0V.

The reset switching branch 14 is designed in such a way that the switch 9 of the reset switching branch is closed when a useful signal is not applied. In the time between the useful signal pulses, the circuit arrangement 21 is therefore "muted" (reset phase). The output signal of the operational amplifier circuit 2 serves as the control signal, which is tapped downstream of the inverting operational amplifier circuit 2 (and corresponds to a control input of the integrator circuit 7, 14). At this point, the interference signal has already been largely filtered out. In addition, a threshold value is set to activate switch 9.

The integrator circuit is designed so that when the threshold value is undershot, switch 9 is closed so that an output voltage of 0V is output as the output signal S7 as described above. Interference signals can thus be completely eliminated between the useful signal pulses. When the control signal rises above the threshold value, the reset switching branch 14 switches the integrator 7 to "integrate" (sampling phase), i.e., the switch 9 is opened, and the signal that has just passed through components 1-6 is output as output signal S7. If the control signal falls below the threshold again, switch 9 is closed again. The delay element 13 (here: parallel connection of capacitance and resistance that are each at a reference potential) causes the capacitor of the delay element 13 to be charged and the switch 9 to remain open as long as voltage is applied to the resistance of the delay element 13 so that the output signal S7 passes through for the entire duration of the useful signal pulse. Afterwards, the signal path is interrupted and the output voltage is again 0V. This allows switching between a sampling phase (switch 9 open) and a reset phase (switch 9 closed).

During the sampling phase, the output voltage (output signal) of the circuit changes as a function of the input voltage. More precisely, the output voltage reflects the integral over the input voltage curve. In the reset phase (switch 9 conductive), the output voltage immediately goes to 0V, regardless of the input voltage.

In the embodiment shown in FIG. 2, the reset switching branch 14 additionally comprises a signal amplifier 8 (e.g. a transistor amplifier) to amplify the tapped control signal and a rectifier 10 for filtering positive peaks of the control signal, wherein these components are connected in series to the switch 9 and the delay element 13.

At the top, FIG. 3 shows a signal combination S1 of individual useful signals with a relatively large time interval between them (left) and quickly successive useful signals (right) with different amplitudes. The corresponding signals S2-S7 are shown in the subsequent lines.

At the top, FIG. 4 and FIG. 5 show an enlarged section of the rapidly successive useful signals from FIG. 3. The subsequent lines show the corresponding sections of the signals S2-S7.

From FIG. 4 it can be clearly seen that the low-frequency interference still present in signal S2 is effectively filtered out by the high-pass filter 1 and is no longer present in signal S3. In FIG. 5, the resulting distortion by the high-pass filter 1 can be seen: Here a part of the signal S3 is convoluted into the negative. The rectifier circuit 3 splits the positive parts and the negative parts of the signal S3 into two (inverted) partial signals S4, S5. This makes it possible to invert one of the partial signals S4, S5 once again so that the distortion from the high-pass filter 1 can be largely compensated by subsequent summation of the partial signals.

Figure 6:
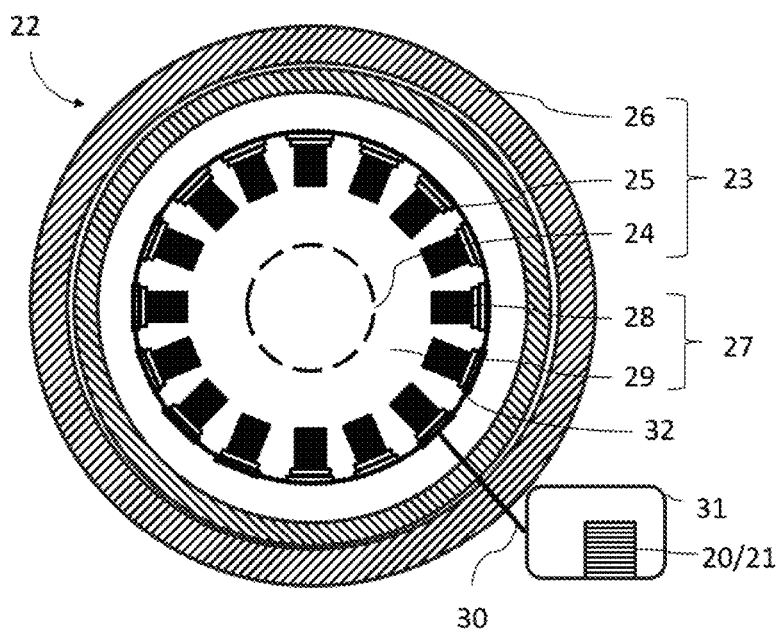
FIG. 6 shows a sectional view of the hybrid imaging device according to the invention perpendicular to the z-direction.

FIG. 6 shows a hybrid imaging device 22 according to the present invention with an MRI arrangement 23 and an emission tomography (ET) arrangement 27. In addition to an RF resonator structure 24, the MRI arrangement 23 comprises a gradient coil system 25 with a longitudinal axis z and a magnetic coil arrangement 26 to generate a static magnetic field. The ET arrangement 27 includes a scintillator 28 and the detector apparatus 12 (in particular a photosensor) which is arranged radially between the gradient coil system 25 and the RF resonator structure 24 in a bore of the MRI arrangement 23 and the ET arrangement 27.

The detector apparatus 12 is connected via the signal line 30 to an image processing unit 31 outside the bore 34. The image processing unit contains the circuit arrangement according to the invention 20, 21 to suppress the interference signals from the MR equipment.

Figure 7:
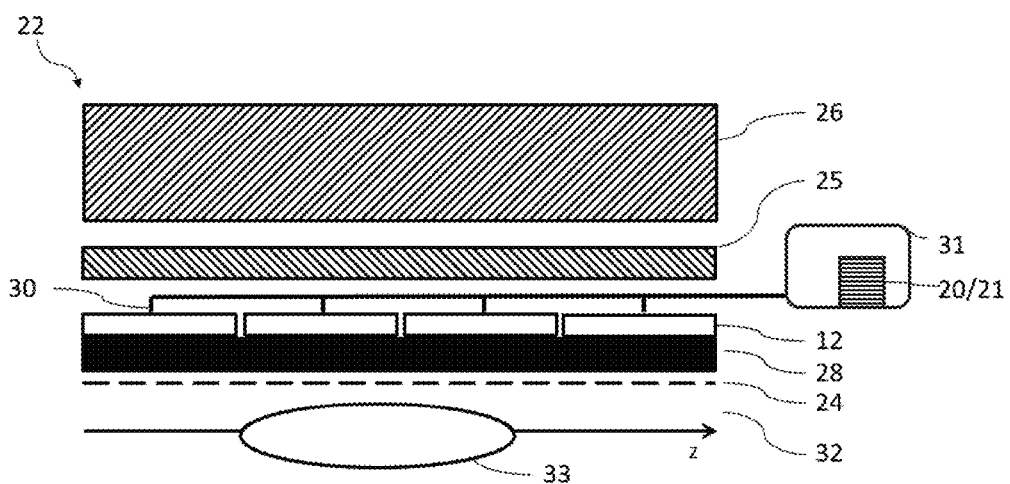
FIG. 7 shows a sectional view of one half of the hybrid imaging device according to the invention along the z-direction.

FIG. 7 shows a sectional view along one half of the hybrid imaging device 22 with a studied object 33, wherein the radial direction r is plotted upwards, and the axial direction of the longitudinal axis z is plotted to the right.

LIST OF REFERENCE SIGNS

1 High-pass filter
2 Inverting operational amplifier circuit (low-impedance amplifier)
3 Rectifier circuit
3a Positive rectifying element of the rectifier circuit
3b Negative rectifying element of the rectifier circuit
4a Low-pass filter for positive rectifying element
4b Low-pass filter for negative rectifying element
5 Summing amplifier circuit
6 Low-pass filters
7 Integrator
7a Operational amplifier of the integrator
7b Capacity of the integrator
8 Signal amplifier of the reset circuit
9 Reset circuit switch
10 Rectifier of the reset circuit
11 Couplings of the interference signals
12 Detector apparatus with photosensor
13 Delay element of the reset circuit
14 Reset switching branch
15 Input interfaces
20 Circuit arrangement without for integrator with reset function
21 Circuit arrangement with for integrator with reset function
22 MR/PET hybrid imaging device
23 Magnetic resonance imaging (MRI) arrangement
24 RF resonator structure/MR HF coil
25 Gradient coil system 26 Magnet coil arrangement
27 Emission tomography (ET) arrangement
28 Scintillator
29 Photosensor
30 Signal line
31 Image processing unit
32 Bore
33 Investigated object
34 Bore
S1 Useful signal
S2 Input signal
S3 Signal after high-pass filter
S4 Partial signal after positive rectifying elements
S5 Partial signal after negative rectifying elements
S6 Signal after summing amplifier circuit
S7 Output signal

The invention claimed is:

1. A circuit arrangement for correcting an input signal (S2), wherein the input signal (S2) at an input interface of the circuit arrangement comprises a useful signal (S1) with a useful frequency and an interference signal with an interference frequency, wherein the circuit arrangement comprises:
a high-pass filter with a cutoff frequency,
an inverting operational amplifier circuit connected downstream from the high-pass filter and connected in series with the high-pass filter,
an active rectifier circuit connected downstream from the inverting operational amplifier circuit and connected in series therewith, having two parallel-connected conduction paths, wherein each conduction path comprises a rectifying element,
a summing amplifier circuit connected downstream from the rectifier circuit, wherein the summing amplifier circuit has an inverting input and a non-inverting input, and each conduction path is electrically connected to one of the inputs of the summing amplifier circuit.

2. The circuit arrangement according to claim 1, wherein the rectifying elements of the rectifier circuit are connected in different directions.

3. The circuit arrangement according to claim 1, wherein the cutoff frequency of the high-pass filter is at most a factor of 10 smaller than the frequency of the useful signal.

4. The circuit arrangement according to claim 1, wherein the cutoff frequency of the high-pass filter is at least a factor of 100 higher than the frequency of the interference signal.

5. The circuit arrangement according to claim 1, wherein the inverting operational amplifier circuit has a low-impedance input resistance.

6. The circuit arrangement according to claim 1, wherein a low-pass filter is connected downstream from each rectifying element.

7. The circuit arrangement according to claim 1, wherein an integrator circuit with reset function is provided with an integrator connected downstream from the summing amplifier circuit and with a reset switching branch, wherein the reset switching branch is designed to tap a control signal after the inverting operational amplifier circuit, preferably between the inverting operational amplifier circuit and the rectifier circuit, and wherein the reset switching branch comprises a switch which bridges a capacitor of the integrator.

8. The circuit arrangement according to claim 7, wherein the reset switching branch comprises a delay element.

9. The circuit arrangement according to claim 1, wherein a low-pass filter is connected downstream from the summing amplifier circuit.

10. A method of correcting an input signal using the circuit arrangement according to claim 1, the method comprising providing at the input interface useful signal (S1) with said useful frequency spectrum and said interference signal with an interference frequency spectrum and receiving downstream of the summing amplifier circuit a corrected version of the input signal.

11. The method according to claim 10 wherein the circuit arrangement is part of a hybrid imaging device comprising a magnetic resonance imaging (MRI) arrangement with a gradient coil system.

12. A hybrid imaging device, comprising:
a magnetic resonance imaging (MRI) arrangement with a gradient coil system and an emission tomography (ET) arrangement with a detector apparatus comprising a photosensor, wherein the ET and MRI arrangements have a common bore in which the detector apparatus is arranged; and
a signal line which conducts useful signal (S1) from a detector apparatus to an image processing unit outside the common bore, wherein the image processing unit comprises a circuit arrangement according to claim 1.

13. The hybrid imaging device according to claim 12, wherein the emission tomography (ET) arrangement is a positron emission tomography arrangement.

14. The hybrid imaging device according to claim 13, wherein the photosensor is a silicon photomultiplier and the useful signal (S1) is analog.

* * * * *